US008836048B2

(12) United States Patent
Cabral, Jr. et al.

(10) Patent No.: US 8,836,048 B2
(45) Date of Patent: Sep. 16, 2014

(54) FIELD EFFECT TRANSISTOR DEVICE HAVING A HYBRID METAL GATE STACK (71) Applicant: International Business Machines Corporation, Armonk, NY (US)

(72) Inventors: Cyril Cabral, Jr., Mahopac, NY (US); Josephine B. Chang, Mahopac, NY (US); Michael P. Chudzik, Danbury, CT (US); Martin M. Frank, Dobbs Ferry, NY (US); Michael A. Guillorn, Yorktown Heights, NY (US); Christian Lavoie, Ossining, NY (US); Shreesh Narasimha, Beacon, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/653,679

(22) Filed: Oct. 17, 2012

(65) Prior Publication Data
US 2014/0103457 A1   Apr. 17, 2014

(51) Int. Cl.
H01L 21/70 (2006.01)
(52) U.S. Cl.
USPC .......................................... 257/407; 257/412
(58) Field of Classification Search
USPC ................... 257/407, 412, 413, 900
See application file for complete search history.

(56) References Cited

U.S. PATENT DOCUMENTS

| 5,923,999 | A | 7/1999 | Balasubramanyam et al. |
| 6,090,700 | A | 7/2000 | Tseng |
| 7,531,881 | B2* | 5/2009 | Lee et al. ........................ 257/369 |
| 7,863,083 | B2 | 1/2011 | Amos et al. |
| 7,871,943 | B2* | 1/2011 | Boescke et al. ................ 438/795 |
| 7,982,514 | B2 | 7/2011 | Biyani |
| 8,367,502 | B2* | 2/2013 | Park et al. ...................... 438/275 |
| 2003/0073277 | A1 | 4/2003 | Cho et al. |
| 2005/0236715 | A1 | 10/2005 | Ku et al. |
| 2006/0197225 | A1 | 9/2006 | Pan et al. |
| 2006/0263962 | A1 | 11/2006 | Weiner |
| 2008/0237728 | A1 | 10/2008 | Mitsuhashi et al. |
| 2009/0200618 | A1 | 8/2009 | Boescke et al. |
| 2010/0164009 | A1 | 7/2010 | Park et al. |

OTHER PUBLICATIONS

United States Official Action dated Sep. 18, 2013 from related U.S. Appl. No. 13/677,489.
United States Final Official Action dated Mar. 20, 2014 from related U.S. Appl. No. 13/677,489.

* cited by examiner

*Primary Examiner* — Mark Prenty
(74) *Attorney, Agent, or Firm* — Scully, Scott, Murphy & Presser, P.C.; Louis J. Percello, Esq.

(57) ABSTRACT

A semiconductor device including a gate structure present on a channel portion of a semiconductor substrate and at least one gate sidewall spacer adjacent to the gate structure. In one embodiment, the gate structure includes a work function metal layer present on a gate dielectric layer, a metal semiconductor alloy layer present on a work function metal layer, and a dielectric capping layer present on the metal semiconductor alloy layer. The at least one gate sidewall spacer and the dielectric capping layer may encapsulate the metal semiconductor alloy layer within the gate structure.

25 Claims, 3 Drawing Sheets

FIELD EFFECT TRANSISTOR DEVICE HAVING A HYBRID METAL GATE STACK

BACKGROUND

The present disclosure relates to semiconductor devices, and more particularly to semiconductor devices including gate structures.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In one embodiment, a semiconductor device is provided that includes a gate structure present on a channel portion of a semiconductor substrate and at least one gate sidewall spacer adjacent to the gate structure. The gate structure may include a work function metal layer present on a gate dielectric layer, a semiconductor-containing layer present on the work function metal layer, a metal semiconductor alloy layer present on the semiconductor-containing layer, and a dielectric capping layer overlaying the metal semiconductor alloy layer. The at least one gate sidewall spacer and the dielectric capping layer may encapsulate the metal semiconductor alloy layer within the gate structure.

In another embodiment, a semiconductor device is provided that includes a gate structure present on a channel portion of a semiconductor substrate and at least one gate sidewall spacer adjacent to the gate structure. The gate structure may include a work function metal layer present on a gate dielectric layer, a metal semiconductor alloy layer in direct contact with the work function metal layer, and a dielectric capping layer present on the metal semiconductor alloy layer. The at least one gate sidewall spacer and the dielectric capping layer may encapsulate the metal semiconductor alloy layer within the gate structure.

In yet another embodiment, a semiconductor device is provided that includes a gate structure present on a channel portion of a semiconductor substrate and at least one gate sidewall spacer adjacent to the gate structure. The gate structure may include a work function metal layer present on a gate dielectric layer, a metal semiconductor alloy layer in direct contact with the work function metal layer, and a dielectric capping layer present on the metal semiconductor alloy layer.

In a further embodiment, a semiconductor device is provided that includes a gate structure present on a channel portion of a semiconductor substrate and at least one gate sidewall spacer adjacent to the gate structure. The gate structure may include a work function metal layer present on a gate dielectric layer, a metal semiconductor alloy layer present on the work function metal layer, and a dielectric capping layer present on the metal semiconductor alloy layer, wherein the gate structure has substantially a same shape after activation anneal than before the activation anneal.

In another aspect of the disclosure, a method of forming a semiconductor device is provided that includes forming a gate stack on a semiconductor substrate comprising the steps of forming a gate dielectric layer on the semiconductor substrate and forming a work function metal layer on the gate dielectric layer. A semiconductor-containing layer is then formed on the work function metal layer. A metal semiconductor alloy layer is then deposited on the semiconductor-containing layer. A dielectric capping layer is then formed on the metal semiconductor alloy layer. The gate stack that is provided by the dielectric capping layer, the metal semiconductor alloy layer, the semiconductor-containing layer, the work function metal layer and the gate dielectric layer is then patterned and etched to provide a gate structure. At least one gate sidewall spacer is formed adjacent to the gate structure, wherein a height of the at least one gate sidewall spacer extends from the semiconductor substrate to at least the dielectric capping layer to encapsulate the metal semiconductor alloy layer within the gate structure.

In one embodiment, the method of forming the semiconductor device is provided that includes forming a gate stack on a semiconductor substrate comprising the steps of forming a gate dielectric layer on the semiconductor substrate and forming a work function metal layer on the gate dielectric layer. A metal semiconductor alloy layer is then deposited directly on the work function metal layer. A dielectric capping layer is then formed on the metal semiconductor alloy layer. The gate stack that is provided by the dielectric capping layer, the metal semiconductor alloy layer, the work function metal layer and the gate dielectric layer is then patterned and etched to provide a gate structure. At least one gate sidewall spacer is formed adjacent to the gate structure, wherein a height of the at least one gate sidewall spacer extends from the semiconductor substrate to at least the dielectric capping layer to encapsulate the metal semiconductor alloy layer within the gate structure.

In a further embodiment, the method of forming the semiconductor device includes forming a gate stack on a semiconductor substrate comprising the steps of forming a gate dielectric layer on the semiconductor substrate and forming a work function metal layer on the gate dielectric layer. A metal semiconductor alloy layer is then deposited directly on the work function metal layer. A dielectric capping layer is then formed on the metal semiconductor alloy layer. The gate stack that is provided by the dielectric capping layer, the metal semiconductor alloy layer, the work function metal layer and the gate dielectric layer is then patterned and etched to provide a gate structure. Source and drain regions are formed on opposing sides of the gate structure. The source and drain regions are activated with an anneal. Following the anneal to activate the source and drain regions, the gate structure has a shape equal to the shape of the gate structure prior to the anneal to activate the source and drain region.

In yet another embodiment, the method of forming the semiconductor device includes forming a gate stack on a semiconductor substrate comprising the steps of forming a gate dielectric layer on the semiconductor substrate and forming a work function metal layer on the gate dielectric layer. A semiconductor containing layer is then formed on the work function metal layer. A metal semiconductor alloy layer is then deposited on the semiconductor-containing layer. A dielectric capping layer is then formed on the metal semiconductor alloy layer. The gate stack that is provided by the dielectric capping layer, the metal semiconductor alloy layer, the semiconductor-containing layer, the work function metal layer and the gate dielectric layer is then patterned and etched to provide a gate structure. Source and drain regions are formed on opposing sides of the gate structure. The source and drain regions are activated with an anneal. Following the anneal to activate the source and drain regions, the gate structure has a shape that is equal to the shape of the gate structure prior to the anneal to activate the source region and the drain region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "vertical", "horizontal", "top", "bottom", and derivatives thereof shall relate to the disclosure, as it is oriented in the drawing figures.

The present disclosure in general relates to semiconductor devices and methods of fabricating semiconductor devices, and in some embodiments, to field effect transistor (FET) structures including metal gate technology and high dielectric constant ("high-k") gate dielectrics. As used herein, the term "semiconductor device" means an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure. A field effect transistor (FET) has three terminals, i.e., a functional gate structure, a source region and a drain region. The gate structure controls output current, i.e., flow of carriers in the channel, of a semiconducting device, such as a field effect transistor (FET), through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant.

Typically, the gate structure of a conventional semiconductor device, e.g., field effect transistor (FET), is formed by depositing a layer of silicon dioxide ($SiO_2$) or silicon oxynitride ($SiO_xN_y$), constituting a gate insulating layer, upon a semiconductor substrate and then depositing poly-crystalline silicon (poly-Si), constituting a gate electrode layer, upon the gate insulator layer. The gate electrode layer and gate insulator layer are then etched to form the appropriate shaped gate structure. As conventional field effect transistors have decreased in size, i.e., have been scaled, the thickness of the gate dielectric within the gate structure has also continued to decrease, in order to maintain good electrostatic control of the channel of the field effect transistor. It has been determined that this decreasing thickness has lead to increased leakage currents due to tunneling through the gate dielectric. To further advance field effect transistor scaling and to reduce the leakage currents, high-k dielectric materials have been introduced, along with metal containing gate electrodes. The high k dielectric in general is deposited on a semiconductor substrate with an optional interface layer (i.e., $SiO_2$ or $SiO_xN_y$) and a electrically conducting layer is deposited on the dielectric to establish the workfunction. On the electrically conducting layer, a semiconductor containing layer can be deposited. Above the semiconductor containing layer, an insulating capping layer is deposited. The stack may then etched to form the appropriate gate shape and gate sidewall spacers are formed adjacent to the gate structure. Conventionally, the insulating capping layer is then removed, exposing the poly-Si electrode. Removal of the insulating capping layer with etch process typically degrades the gate sidewalls spacers, which can expose a portion of the conductive features of the gate structure. This degradation of the gate sidewall spacers is typically referred to as gate sidewall spacer pull down.

A salicide process (in which a metal reacts with silicon to form a self-aligned silicide) is typically performed to lower the contact resistance of the gate structure. Silicide formation typically requires depositing a refractory metal, such as Ni, Co or Ti, onto the surface of a Si-containing material or wafer. Following deposition, the structure is then subjected to an annealing step using a thermal anneal process such as, rapid thermal annealing. During thermal annealing, the deposited metal reacts with silicon (Si) forming a metal silicide. It has been discovered that the removal of the insulating capping layer on the poly-Si and the salicide process can both result in gate to source leakage or gate to drain leakage. This leakage comes about due to silicide filaments that can form over the gate sidewall spacers during the salicide processing. Additionally, the gate sidewall spacer pull down effects may expose portions of the conductive features of the gate structure, which can further lead to gate leakage and shorting of the device. Further, it has been determined that when forming a silicide from a salicide process there is a large volume expansion of the preformed gate (typically >5%), which can exacerbate the leakage.

In some embodiments, the methods and structures disclosed herein can eliminate the need to form a metal semiconductor alloy, e.g., silicide, on the gate structure following patterning of the gate structure using deposition and anneal processes. Referring to FIGS. 1A-5B, the methods and structures disclosed herein provide for the deposition of a metal semiconductor alloy within the gate stack prior to patterning of the gate stack to form the gate structure. Although the semiconductor devices that are formed in the process sequence depicted in the drawings are field effect transistors (FET), the present disclosure is not limited to only this type of semiconductor device. For example, the present disclosure is suitable for use with any semiconductor device including a gate structure having a metal semiconductor alloy present therein.

Figure 1A:
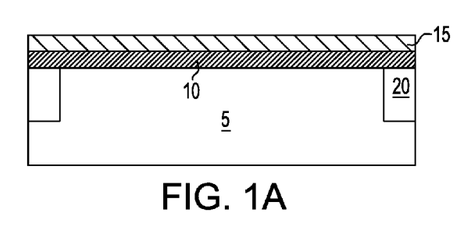
FIG. 1A is a side cross-sectional view depicting forming a gate dielectric layer and a work function metal layer on a semiconductor substrate, in accordance with one embodiment of the present disclosure.

FIG. 1A depicts one embodiment of forming a gate dielectric layer 10 and a work function metal layer 15 on a semiconductor substrate 5. The semiconductor substrate 5 can be composed of a semiconductor material that may include, but is not limited to, Si, Ge, SiGe, SiGeC, SiC, Ge alloys, GaSb, GaP, GaAs, InAs, InP, and all other III-V or II-VI compound semiconductors. In some embodiments, the semiconductor substrate 5 is a bulk semiconductor material. In other embodiments, the semiconductor substrate 5 may comprise a layered semiconductor material such as, for example, a semiconductor-on-insulator or a semiconductor on a polymeric substrate. Illustrated examples of semiconductor-on-insulator substrates that can be employed as semiconductor substrate 5 include silicon-on-insulators and silicon-germanium-on-insulators.

The semiconductor substrate 5 may include isolation regions 20 that define the semiconductor device area, e.g., transistor area, of the semiconductor substrate 5. The isolation regions 20 may be shallow trench isolation (STI) regions that are formed by etching a trench in the semiconductor substrate 5 utilizing a dry etching process, such as reactive-ion etching (RIE) or plasma etching. Chemical vapor deposition (CVD) or another like deposition process may then be used to fill the trench with a dielectric material. A planarization process, such as chemical-mechanical polishing (CMP) may optionally be used to provide a planar structure. The semiconductor device area within the semiconductor substrate 5 that is defined by the isolation regions 20 may include a well region that is doped with an n-type or p-type dopant.

For example, when the semiconductor device has an n-type conductivity, such as an nFET, the well region may be doped to a p-type conductivity. In another example, when the semiconductor device has a p-type conductivity, the well region may be doped to an n-type conductivity. The dopant for the well region may be introduced to the semiconductor substrate 5 using ion implantation.

The gate dielectric layer 10 and the work function metal layer 15 that are deposited on the semiconductor substrate 5 can be initial layers of the gate stack that is latter patterned and etched to provide the gate structure of the semiconductor device of the present disclosure. The gate dielectric layer 10 may be composed of any dielectric material including oxide, nitride and oxynitride containing dielectrics. For example, when the gate dielectric layer 10 is composed of an oxide, the gate dielectric layer 10 may be composed of silicon oxide ($SiO_2$). In another example, the gate dielectric layer 10 may be composed of a high-k dielectric material. The term "high-k" denotes a material having a dielectric constant that is greater than the dielectric constant of silicon oxide ($SiO_2$). For example, a high-k dielectric material typically has a dielectric constant that is greater than 3.9. In another example, a high-k dielectric material that may be employed for the gate dielectric layer 10 has a dielectric constant that is greater than 10. In yet another embodiment, the high-k gate dielectric layer is comprised of a material having a dielectric constant ranging from 10 to 30. The dielectric constants mentioned herein are relative to a vacuum at room temperature, i.e., 20° C. to 25° C.

The high-k dielectric layer can include at least one metallic element. Some examples of high-k dielectric materials suitable for the gate dielectric layer 10 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the gate dielectric layer 10 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. In one embodiment, the gate dielectric layer 10 has a thickness that ranges from 1 nm to 10 nm. In another embodiment, the gate dielectric layer 10 has a thickness that ranges from 1 nm to 4 nm.

The gate dielectric layer 10 is typically formed using a deposition process, such as chemical vapor deposition (CVD). Variations of chemical vapor deposition (CVD) processes for depositing the gate dielectric layer 10 include, but are not limited to, atmospheric pressure CVD (APCVD), low pressure CVD (LPCVD) and plasma enhanced CVD (PECVD), metal-organic CVD (MOCVD) and combinations thereof. In another embodiment, the gate dielectric layer 10 may be formed by a thermal growth process such as, for example, oxidation, nitridation or oxynitridation. In yet another embodiment, the gate dielectric layer 10 may be formed using physical vapor deposition (PVD). In yet still another embodiment, the gate dielectric layer 10 may be formed using atomic layer deposition (ALD).

Although FIG. 1A only depicts a single gate dielectric layer 10, the methods and structures disclosed herein are not limited to only this example; instead any number of gate dielectric layers 10 may be employed herein. In one embodiment, an interfacial dielectric layer (not shown) may be present between the upper surface of the semiconductor substrate 5 and the gate dielectric layer 10. The interfacial dielectric layer may be composed of an oxide, such as silicon oxide or silicon oxynitride, and may have a thickness ranging from 0.3 nm to 4 nm. The interfacial dielectric layer may be formed using thermal oxidation before or after the formation of the gate dielectric layer 10.

The work function metal layer 15 may be formed directly on the upper surface of the gate dielectric layer 10. Some examples of suitable materials for the work function metal layer include titanium nitride (TiN), tantalum nitride (TaN), titanium silicon nitride (TiSiN), tantalum silicon nitride (TaSiN), titanium carbide (TiC), tantalum carbide (TaC or $Ta_2C$) and combinations thereof. In some embodiments, the base material for the work function metal layer 15 is doped with at least one of La, Al, Dy or a combination thereof to further effectuate an effective work function shift. The work function metal layer 15 may be deposited using physical vapor deposition (PVD), chemical vapor deposition (CVD) or atomic layer deposition (ALD) processes. The thickness of the work function metal layer 15 may range from 1 nm to 10 nm. The work function metal layer 15 may be an n-type work function metal layer or a p-type work function metal layer that is incorporated into a gate structure as a means to adjust the threshold voltage of the corresponding device. As used herein, an "n-type work function metal layer" is a metal containing layer that effectuates an n-type (i.e., negative) threshold voltage shift, i.e. a threshold voltage shift that results in a negative threshold voltage shift . As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the effective work function of the n-type work function metal layer ranges from 4.1 eV to 4.3 eV. As used herein, a "p-type work function metal layer" is a metal containing layer that effectuates a p-type (i.e., positive) threshold voltage shift. In one embodiment, the effective work function of the p-type work function metal layer ranges from 4.9 eV to 5.2 eV. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, a work function metal layer 15 that is an n-type work function metal layer may comprise at least one of TiN, HfN, HfSi, or combinations thereof. The n-type work function metal layer can be deposited using chemical vapor deposition (CVD), atomic layer deposition (ALD), sputtering or plating. In one embodiment, the n-type work function metal layer comprises TiN, and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer comprising TiN is sputtered from a solid target comprised of titanium and nitrogen. In one embodiment, the thickness of the n-type work function metal layer may range from 0.1 nm to 4 nm. In another embodiment, the thickness of the n-type work function metal layer may range from 0.2 nm to 2 nm.

In one embodiment, a work function metal layer 15 that is a p-type work function metal layer may be composed of TiN. In some embodiments, when TiN is used for both a p-type work function metal layer and an n-type work function metal layer, effective work function tuning may be provided by doping the TiN. For example, La dopant may provide for effective work function tuning in the TiN for the p-type work function metal layer, and Al dopant may provide for the effective work function tuning in the TiN for the n-type work function metal layer. The p-type work function metal layer may also be composed of TiAl, TiAlN, Ru, Pt, Mo, Co and alloys and combinations thereof. In one embodiment, the p-type work function metal layer comprising titanium and aluminum may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD). In one embodiment, the thickness of the p-type work function metal layer may range from 0.1 nm to 5 nm. In another embodiment, the thickness of the p-type work function metal layer may range from 0.2 nm to 2 nm.

Figure 1B:
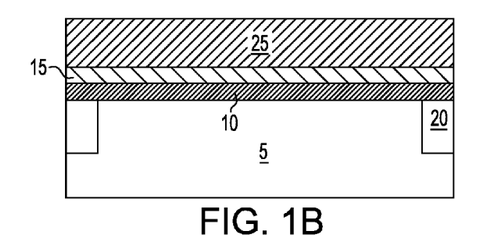
FIG. 1B is a side cross-sectional view depicting forming a gate dielectric layer, a work function metal layer and a semiconductor-containing layer on a semiconductor substrate, in accordance with one embodiment of the present disclosure.
Figure 2A:
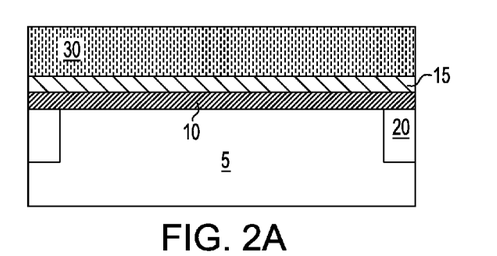
FIG. 2A is a side cross-sectional view depicting depositing a metal semiconductor alloy layer directly on the work function metal layer that is depicted in FIG. 1A.
Figure 2B:
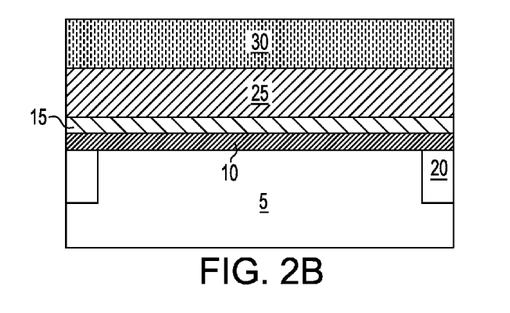
FIG. 2B is a side cross-sectional view depicting depositing a metal semiconductor alloy layer directly on the semiconductor-containing layer that is depicted in FIG. 1B.

FIG. 1B depicts another embodiment of the present disclosure in which a semiconductor-containing layer 25 is deposited on the work function metal layer 15 before depositing the metal semiconductor alloy layer 30 that is depicted in FIGS. 2A and 2B. In some embodiments, the semiconductor-containing layer 25 is deposited to avoid any increase in electrical thickness of the gate dielectric layer 10 due to oxygen causing interfacial $SiO_2$ regrowth.

The semiconductor substrate 5, the gate dielectric layer 10, and the work function metal layer 15 that are depicted in FIG. 1B, are similar to the semiconductor substrate 5, the gate dielectric layer 10, and the work function metal layer 15 that are depicted in FIG. 1A. Therefore, the description of the semiconductor substrate 5, the gate dielectric layer 10, and the work function metal layer 15 that is made with reference to FIG. 1A is suitable for the semiconductor substrate 5, the gate dielectric layer 10, and the work function metal layer 15 that are depicted in FIG. 1B.

The semiconductor-containing layer 25 may be composed of any semiconductor material. For example, the semiconductor-containing layer 25 may be a silicon-containing material. Examples of silicon-containing materials that are suitable for the semiconductor-containing layer 25 include, but are not limited to, silicon (Si), single crystal silicon, polycrystalline silicon, amorphous silicon, Si doped with C (Si:C) and the above-mentioned silicon-containing materials with some or all of the Si replaced by Ge. Other examples of semiconductor materials that are suitable for the semiconductor-containing layer 25 include GaSb, GaP, GaAs, InAs, InP, and all other III-V or II-VI compound semiconductors.

In one embodiment, the semiconductor-containing layer 25 is deposited as an amorphous or polycrystalline silicon layer using a physical vapor deposition (PVD), chemical vapor deposition (CVD) or atomic layer deposition (ALD) process. The silicon layer that provides the semiconductor-containing layer 25 can be doped with arsenic (As), phosphorus (P) or boron (B) impurities to improve the electrical conductivity. The thickness of semiconductor-containing layer 25 is typically between 1 nm and 50 nm. In some embodiments, the thickness of the semiconductor-containing layer 25 ranges from 5 nm to 25 nm.

FIG. 2A depicts depositing a metal semiconductor alloy layer 30 directly on the work function metal layer 15 that is depicted in FIG. 1A. The term "metal semiconductor alloy" denotes a substance with metallic properties, composed of two or more chemical elements of which at least one is a metal and another is a semiconductor. As used herein, "metallic" is a material with electrically conductive properties. In some embodiments, the electrically conductive properties of the metal semiconductor alloy layer 30 include a sheet resistance of less than 50 Ohm/square. In one example, the sheet resistance of the metal semiconductor alloy layer 30 is less than 25 Ohm/square. In another example, the sheet resistance of the metal semiconductor alloy layer 30 ranges from 10 Ohm/square to 20 Ohm/square. Some examples of compositions that are suitable for the metal semiconductor alloy layer 30 include, but are not limited to tungsten silicide (WSW, titanium silicide ($TiSi_x$), tantalum silicide ($TaSi_x$), niobium silicide ($NbSi_x$), and vanadium silicide ($VSi_x$), wherein x ranges from 1.6 to 2.4. In one example, the metal semiconductor alloy layer may be composed of $TiSi_x$, with x ranging from 1.60 to 1.99. In one example, the metal semiconductor alloy layer is comprised of $TiSi_x$ with x ranging from 2.01 to 2.40. The metal semiconductor alloy layer is composed of a material comprised of $TiSi_x$ with inclusion of up to 10 atomic percent Ta or Nb. The aforementioned compositions are provided for illustrative purposes only and are not intended to limit the present disclosure. The thickness of the metal semiconductor alloy layer 30 may range from 5 nm to 100 nm. In one embodiment, the thickness of the metal semiconductor alloy layer 30 may range 10 nm to 80 nm. In yet another embodiment, the thickness of the metal semiconductor alloy layer 30 may range from 12 nm to 25 nm.

The aforementioned metal semiconductor alloy compositions may have a thermal stability that can withstand the temperatures of the activation anneal for the later formed source and drain regions. The term thermal degradation refers to changes in the thermally stable semiconductor alloy that take place above a specific temperature, making it no longer thermally stable. These changes can result in an increase of resistivity, a change in shape and a change in the compositional homogeneity. Measurements of sheet resistance and physical structure (i.e. XSEM and XTEM) can reveal these changes. For example, the above described metal semiconductor alloy compositions may be thermally stable at temperatures greater than 900° C. In another example, the above described metal semiconductor alloy compositions may be thermally stable at temperatures greater than 950° C., and in some examples may be thermally stable to temperatures as great as 1000° C. (i.e. Ti(4.5 at. %Ta)$Si_{2.3}$ semiconductor alloy). It is noted that other compositions for the metal semiconductor alloy layer 30 are within the scope of the present disclosure, so long as the composition of the metal semiconductor alloy layer 30 can withstand temperatures of 900° C. or higher, such as 950° C. or higher.

By providing enhanced thermal stability to temperatures of 900° C. or greater, the metal semiconductor alloy layer 30 may be subjected to the activation anneal for the source and drain regions without effectuating a thermal degradation of the metal semiconductor alloy layer 30 within the gate structure. Therefore, because the shape and compositional homogeneity of the metal semiconductor alloy layer 30 is not impacted by the activation anneal, the metal semiconductor alloy layer 30 component of the gate structure will have the same shape after the activation anneal that is had before the activation anneal. Any change, i.e., shape change, of the metal semiconductor alloy layer 30 during the later described activation anneal of the source and drain regions should be less than 5%. In some embodiments, the low resistivity metal semiconductor alloy, e.g., silicide, may be rectangular in shape, and may have a flat interface with the underlying surface, e.g., the work function metal layer 15, a flat interface with the overlying surface, e.g., subsequently described dielectric cap layer, and no evidence of any protrusions.

The metal semiconductor alloy layer 30 is formed by a deposition method, which co-deposits the metal elements and the semiconductor elements of the metal semiconductor alloy layer 30 simultaneously. Co-deposition of the metal and semiconductor elements of the metal semiconductor alloy layer 30 is differentiated from depositing a metal layer on a previously formed semiconductor surface and annealing the deposited metal and semiconductor surface to promote co-diffusion of the metal and semiconductor elements to form a silicide, such as practiced in salicide processing. Co-deposition of the metal elements and the semiconductor elements of the metal semiconductor alloy layer 30 may be provided by physical vapor deposition (PVD), chemical vapor deposition (CVD) and atomic layer deposition (ALD).

In one embodiment, co-deposition of the semiconductor elements and the metal elements of the metal semiconductor alloy layer 30 is provided by a dual target sputtering apparatus. Sputtering is a form of physical vapor deposition (PVD). Examples of sputtering apparatuses suitable for the metal semiconductor alloy layer 30 include DC diode type systems, radio frequency (RF) sputtering, magnetron sputtering, and ionized metal plasma (IMP) sputtering. Typically, in the sputtering deposition process, high energy particles strike a solid slab of a high-purity target material, in which the high energy particles physically dislodge atoms of the target material. These sputtered atoms typically migrate through a vacuum and deposit on the deposition surface, e.g., the work function metal layer 15. In a dual target sputtering system, there are two targets composed of target material. The first target may provide the metal source and the second target may provide a silicon source. The first and second targets may both be charged, e.g., negatively charged, and may be referred to as a cathode. The deposition surface is typically charged opposite, e.g., positively charged, the first and second targets, and is typically referred to as an anode.

In one example, if the desired composition of the metal semiconductor alloy layer 30 is tungsten silicide ($WSi_x$) the dual target sputtering apparatus would contain one target composed of tungsten (W) and another target composed of silicon (Si). In another example and when the desired composition of the metal semiconductor alloy later is tantalum silicon or titanium silicon, one of the two targets will be composed of the metal, such as tantalum or titanium, and the other target will be composed of silicon.

In another embodiment, sputter deposition of the co-deposited metal and semiconductor elements for the metal semiconductor alloy layer 30 is provided from a single target. For example, when the desired composition of the metal semiconductor alloy layer 30 is titanium silicide ($TiSi_x$) the single target sputtering apparatus would contain one target having a titanium silicide (TiSi$_x$) composition that is desired to be deposited. In another example when the desired composition of the metal semiconductor alloy layer is tungsten silicide (WSi$_x$), the single target sputtering apparatus would contain one target having a tungsten silicide (WSi$_x$) composition that is desired to be deposited. In another example and when the desired composition of the metal semiconductor alloy later is tantalum silicide, the single target sputtering apparatus would contain one target having a tantalum composition that is desired to be deposited. Similar to the dual sputtering system, in a single target sputtering system, the single target may be negatively charged, and may be referred to as a cathode, while the deposition surface is positively charged, and is typically referred to as an anode.

In another embodiment, the metal and semiconductor elements may be co-deposited using chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. To provide for co-deposition of the metal and semiconductor elements for the metal semiconductor alloy layer 30, the chemical vapor deposition (CVD) method may include two gas precursors, in which one gas precursor can provide the semiconductor element and the second gas precursor can provide the metal element. For example, when the semiconductor element is silicon, the silicon gas source for epitaxial deposition may be selected from the group consisting of hexachlorodisilane (Si$_2$Cl$_6$), tetrachlorosilane (SiCl$_4$), dichlorosilane (Cl$_2$SiH$_2$), trichlorosilane (Cl$_3$SiH), methylsilane ((CH$_3$)SiH$_3$), dimethylsilane ((CH$_3$)$_2$SiH$_2$), ethylsilane ((CH$_3$CH$_2$)SiH$_3$), methyldisilane ((CH$_3$)Si$_2$H$_5$), dimethyldisilane ((CH$_3$)$_2$Si$_2$H$^4$), hexamethyldisilane ((CH$_3$)$_6$Si$_2$) and combinations thereof. Examples of gas precursors for the metal element of the metal semiconductor alloy may include orgometallic compounds or complexes such as, for example, TiCl$_4$, TaCl$_4$, MoCl$_5$, WF$_6$, Ni(Co)$_4$.

In another embodiment, the metal and semiconductor elements may be co-deposited using atomic layer deposition (ALD). Atomic layer deposition (ALD) uses sequential self-limiting surface reactions to deposit material layers in the monolayer thickness regime. Atomic layer deposition (ALD) is similar in chemistry to chemical vapor deposition (CVD), except that the atomic layer deposition (ALD) reaction breaks the chemical vapor deposition reaction into two half-reactions, keeping the precursor materials separate during the reaction. Due to the characteristics of self-limiting and surface reactions, atomic layer deposition film growth makes atomic scale deposition control possible. By keeping the precursors separate throughout the coating process, atomic layer control of film growth can be obtained as fine as ~0.1 Å per cycle. Separation of the precursors is accomplished by pulsing a purge gas (typically nitrogen or argon) after each gas precursor pulse to remove excess precursor from the deposition chamber of the atomic layer deposition apparatus.

It is noted that the above described deposition methods are provided for illustrative purposes only and are not intended to limit the present disclosure. The metal semicondutor alloy layer 30 may be deposited using any method that allows for co-deposition of the metal and semiconductor elements on the deposition surface substantially simultaneously.

FIG. 2A depicts that the metal semiconductor alloy layer 30 is formed in direct contact with the work function metal layer 15. The terms "direct contact" and "directly on" mean that a first element, such as the metal semiconductor alloy layer 30, and a second element, such as the work function metal layer 15, are connected without any intermediary conducting, insulating or semiconductor layers at the interface of the two elements. Therefore, for example, an intermediate silicon (Si), such as polysilicon and/or single crystal silicon may not be present between the metal semiconductor alloy layer 30 and the work function metal layer 15 that are in direct contact with each other as depicted in FIG. 2A. FIG. 2B depicts where the metal semiconductor alloy layer 30 is present in direct contact with the semiconductor-containing layer 25, in which the metal semiconductor alloy layer 30 is present over the underlying work function metal layer 15. The terms "overlying", "atop", "positioned on" or "positioned atop" mean that a first element, such as a metal semiconductor alloy layer 30, is present on a second element, such as a work function metal layer 15, wherein intervening elements, such as the semiconductor-containing layer 25 may be present between the first element and the second element, as depicted in FIG. 2B.

Figures 3A, 3B, 4A, 4B:
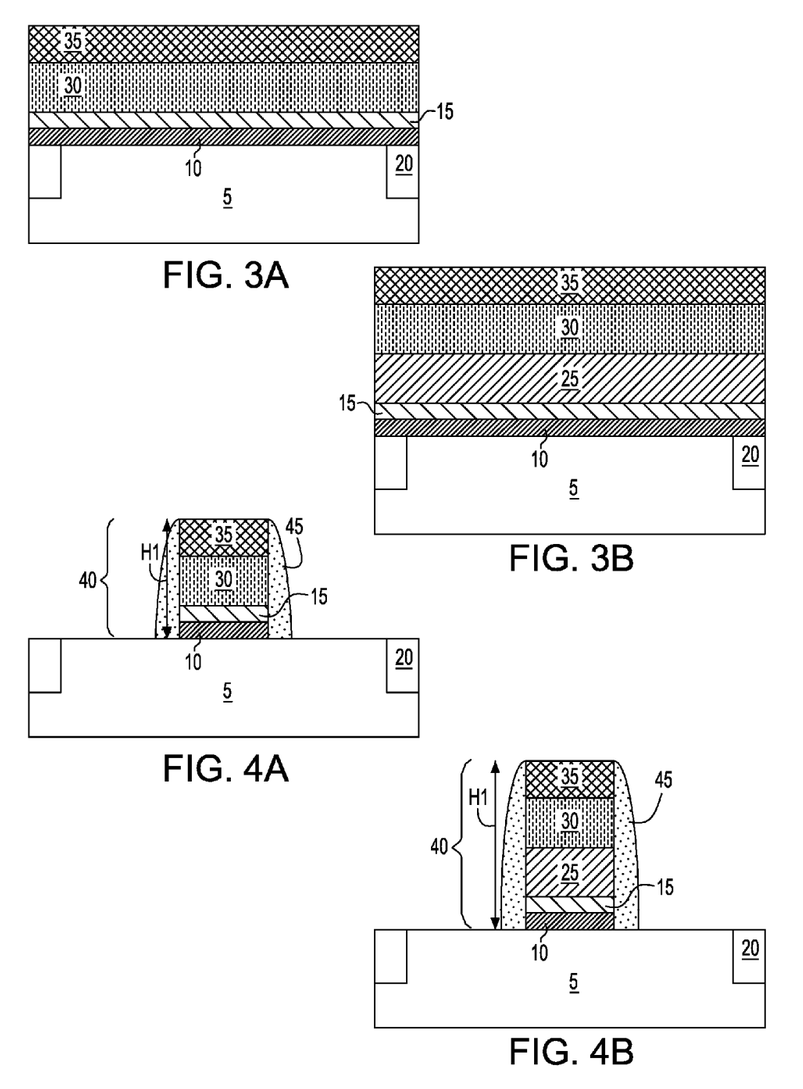
FIG. 3A is a side cross-sectional view depicting forming a dielectric capping layer on the metal semiconductor alloy layer that is depicted in FIG. 2A.
FIG. 3B is a side cross-sectional view depicting forming a dielectric capping layer on the metal semiconductor alloy layer that is depicted in FIG. 2B.
FIG. 4A is a side cross-sectional view depicting patterning and etching the gate stack provided by the dielectric capping layer, the metal semiconductor alloy layer, the work function metal layer and the gate dielectric layer that is depicted in FIG. 3A to provide a gate stack, and forming at least one gate sidewall spacer adjacent to the gate structure.
FIG. 4B is a side cross-sectional view depicting patterning and etching the gate stack provided by the dielectric capping layer, the metal semiconductor alloy layer, the semiconductor-containing layer, the work function metal layer and the gate dielectric layer that is depicted in FIG. 3B to provide a gate structure, and forming at least one gate sidewall spacer adjacent to the gate structure.

FIG. 3A and 3B depict forming a dielectric capping layer 35 on the metal semiconductor alloy layer 30. The dielectric capping layer 35 may be composed of any dielectric material including oxides, nitrides, and oxynitrides. For example, the dielectric capping layer 35 may be selected from the group consisting of silicon-containing materials, such as SiO$_2$, Si$_3$N$_4$, SiO$_x$N$_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). In some embodiments, the dielectric capping layer 35 may be silicon oxide (SiO$_2$), silicon nitride (Si$_3$N$_4$), silicon oxynitride (SiO$_x$N$_y$), aluminum oxide (Al$_2$O$_3$), hafnium oxide (HfO$_2$), zirconium oxide (ZrO$_2$) and combinations or multi-layers thereof. Other dielectric layers have also been contemplated for the dielectric capping layer 35. In one embodiment, the dielectric capping layer 35 may have a thickness ranging from 5 nm to 100 nm. In another embodiment, the dielectric capping layer 35 may have a thickness ranging from 20 nm to 50 nm.

The dielectric capping layer 35 may be formed using a deposited process, such as chemical vapor deposition (CVD). Variations of CVD processes that are suitable for forming the dielectric capping layer 35 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric capping layer 35 may also be deposited using evaporation, chemical solution deposition, spin on deposition, and physical vapor deposition (PVD) methods.

In some embodiments, the dielectric capping layer 35 is the final and topmost layer of the gate stack that is formed on the semiconductor substrate 5. In FIG. 3A, the gate stack includes a gate dielectric layer 10 that is present on the semiconductor substrate 5, a work function metal layer 15 that is present on the gate dielectric layer 10, a metal semiconductor alloy layer 30 present on the work function metal layer 15 and a dielectric capping layer 35 present on the metal semiconductor alloy layer 30. In FIG. 3B, the gate stack includes a gate dielectric layer 10 that is present on the semiconductor substrate 5, a work function metal layer 15 that is present on the gate dielectric layer 10, a semiconductor-containing layer 25 present on the work function meta layer 15, a metal semiconductor alloy layer 30 present on the semiconductor-containing layer 25, and a dielectric capping layer 35 that is present on the metal semiconductor alloy layer 30.

FIGS. 4A and 4B depict patterning the gate stacks that are depicted in FIGS. 3A and 3B to provide a gate structure 40. In some embodiments, the gate stacks may be patterned using photolithography and etching. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an $O_2$ ash process, or the patterned resist may be stripped using a wet chemical process. In one embodiment, the gate stack includes a silicon oxynitride interface layer ($SiO_xN_y$) that is present on a silicon surface having a (100) crystal orientation, a high-k gate dielectric layer 10, a doped titanium nitride (TiN) work function metal layer 15, a silicon (Si) semiconductor-containing layer 25, and a titanium silicon ($TiSi_x$) metal semiconductor alloy layer 30.

Still referring to FIGS. 4A and 4B, at least one gate sidewall spacer 45 may be formed on the sidewall of the gate structure 40 using deposition and etch processes. In one embodiment, the at least one gate sidewall spacer 45 has a width, as measured at the base of the at least one gate sidewall spacer 45, ranging from 3 nm to 40 nm. In another embodiment, the at least one gate sidewall spacer 45 has a width, as measured at the base of the at least one gate sidewall spacer 45, ranging from 5.0 nm to 20.0 nm. The at least one gate sidewall spacer's 45 width may taper, i.e., may reduce, in the direction from the semiconductor substrate 5 towards the upper surface of the gate structure 40.

The at least one gate sidewall spacer 45 may be comprised of a dielectric material, such as a nitride, e.g., silicon nitride. In one embodiment, the at least one gate sidewall spacer 45 may be comprised of a low-k dielectric material, which typically has a dielectric constant that is less than 4.0, e.g., 3.9. In one embodiment, the at least one gate sidewall spacer 45 is comprised of a low-k dielectric material having a dielectric constant ranging from 1.75 to 3.5. Examples of materials suitable for low-k dielectric spacers include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The height H1 of the at least one gate sidewall spacer 45 extends from the upper surface of the semiconductor substrate 5 to at least beyond the lower surface of the dielectric capping layer 35. In some embodiments, the upper surface of the at least one gate sidewall spacer 45 is substantially coplanar with the upper surface of the dielectric capping layer 35.

The at least one gate sidewall spacer 45 in combination with the dielectric capping layer 35 of the gate structure 40 encapsulates the metal semiconductor alloy layer 30 portion of the gate structure 40. By "encapsulate" it is meant that the at least one gate sidewall spacer 45 and the dielectric capping layer 35 contain the metal semiconductor alloy layer 30 within the width and height of the gate structure 40 so that the metal semiconductor alloy layer 30 can not extend beyond the dimensions of the gate structure 40. In some embodiments, by encapsulating the metal semiconductor alloy layer 30 with the dielectric capping layer 35 and the at least one gate sidewalls spacer 45, the methods and structure disclosed herein reduce, if not eliminate, shorting of the metal semiconductor alloy layer 30 to the subsequently formed source and drain regions.

Figure 5A:
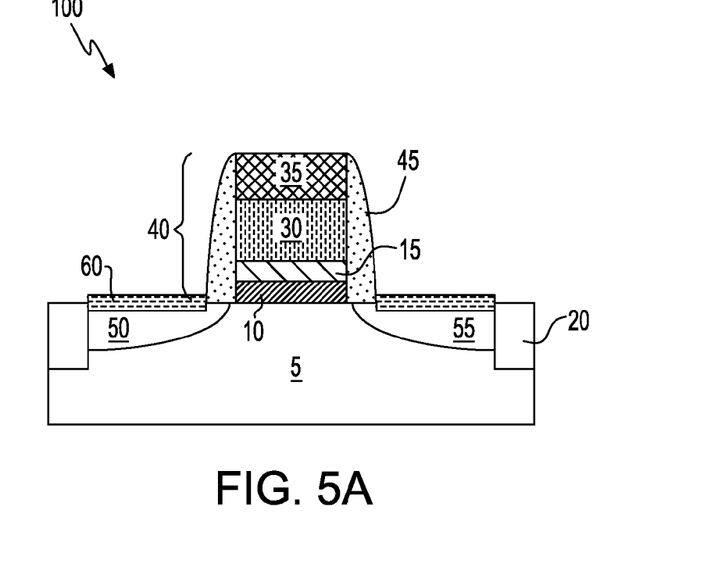
FIG. 5A is a side cross-sectional view depicting forming a source region and a drain region on opposing sides of the gate structure depicted in FIG. 4A.
Figure 5B:
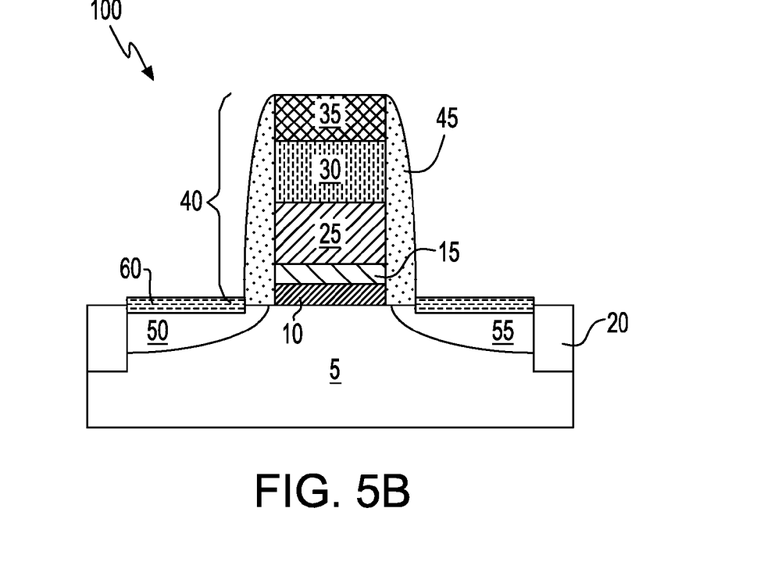
FIG. 5B is a side cross-sectional view depicting forming a source region and a drain region on opposing sides of the gate structure depicted in FIG. 4B.

Referring to FIGS. 5A and 5B and following the formation of the at least one gate sidewall spacer 45, source regions 50 and drain regions 55 are formed in the semiconductor substrate 5 on opposing sides of the gate structure 40. A drain region 55 is a doped region in semiconductor device that is located at one end of the channel, in which carriers are flowing out of the transistor. The source region 50 is a doped region in the semiconductor device that is located on the other end of the channel in which majority carriers are flowing into the channel. The channel is the region underlying the gate structure 40 and between the source region 50 and the drain region 55 of the semiconductor device that becomes conductive when the semiconductor device is turned on. In one embodiment, the source and drain regions 50, 55 of the semiconductor device include extension source and drain regions, deep source and drain regions (not shown), and halo regions (not shown). The source and drain regions 50, 55 may be formed using an ion implantation process. P-type source extension regions for a p-type semiconductor device are typically produced with group III-A elements and n-type source extension regions for an n-type semiconductor device are typically produced with group V elements. In the case of the p-type implants, a typical impurity species is boron or $BF_2$. Boron with an energy of 0.2 keV to 3.0 keV or $BF_2$ with an energy of 1.0 keV to 15.0 keV and a dose of $5 \times 10^{13}$ atoms/$cm^2$ to about $3 \times 10^{16}$ atoms/$cm^2$ can be used to implant the p-type region. A typical implant for the n-type regions is arsenic. The n-type regions can be implanted with arsenic using an energy of 0.5 keV to 5.0 keV with a dose of $3 \times 10^{13}$ atoms/$cm^2$ to $3 \times 10^{16}$ atoms/$cm^2$. Deep source and drain regions are typically the same conductivity as their corresponding source and drain extensions regions, but typically have a greater dopant concentration and are implanted with a higher energy. Halo regions are typically formed using an angled implant and have an opposite conductivity as their corresponding source and drain extensions regions.

Still referring to FIGS. 5A and 5B, in some embodiments, metal semiconductor alloy contacts 60, such as silicide contacts, may be formed on an upper surface of the source region 50 and the drain region 55. In one embodiment, a silicon-containing metal semiconductor alloy contacts 60 may be formed by depositing a refractory metal, such as Co, Ni or Ti, onto the surface of a Si-containing source region 50 and/or drain region 55. Following deposition, the structure is then subjected to an annealing step using conventional processes such as, but not limited to, rapid thermal annealing. During thermal annealing, the deposited metal reacts with silicon forming a metal silicide. The portions of the refractory metal that are not deposited on a semiconductor are not converted to a metal semiconductor alloy, and may be removed by selective etching.

The source and drain regions 50, 55, may be activated by an annealing process including, but not limited to, rapid thermal anneal. Rapid thermal annealing can be carried out using a temperature ranging from 750° C. to 1200° C. for a time period of about 1.0 second to about 20.0 seconds. In one example, the annealing temperature used in activating the source and drain regions 50, 55 is 950° C. or above, and the annealing time is typically about 5 seconds or below. The composition of the metal semiconductor alloy layer 30 within the gate structure 40 is thermally stable within the above-mentioned temperatures for the activation anneal of the source and drain regions 50, 55. Because the metal semiconductor alloy layer 30 is thermally stable, the metal semiconductor alloy layer 30 does not experience a shape change during the activation anneal. For example, the shape change of the metal semiconductor alloy layer 30 during the activation anneal is limited to 5% or less. In another example, the shape change of the metal semiconductor layer is limited to 2.5% or less. In yet another example, there is no shape change of the metal semiconductor layer 30 during the activation anneal. Therefore, the shape of the gate structure 40 including the metal semiconductor alloy layer 30 after the activation anneal is the same as the shape of the gate structure 40 before the activation anneal.

FIG. 5A depicts one embodiment of a semiconductor device 100 that includes a gate structure 40 present on a channel portion of a semiconductor substrate 5 and at least one gate sidewall spacer 45 adjacent to the gate structure 40. In one embodiment, the gate structure 40 includes a work function metal layer 15 overlaying a gate dielectric layer 10, a metal semiconductor alloy layer 30 in direct contact with the work function metal layer 15, and a dielectric capping layer 35 overlaying the metal semiconductor alloy layer 30. The direct contact of the metal semiconductor alloy layer 30 to the work function metal layer 15 eliminates the presence of an intermediate material, such as polysilicon, between the metal semiconductor alloy layer 30 and the work function metal layer 15.

In one embodiment, the at least one gate sidewall spacer 45 and the dielectric capping layer 35 encapsulate the metal semiconductor alloy layer 30 within the gate structure. By depositing the metal semiconductor alloy layer 30 before forming the dielectric capping layer 35 on the upper surface of the metal semiconductor alloy layer 30, instead of removing the dielectric capping layer with a selective etch and converting an exposed silicon layer to a metal semiconductor layer (eliminating the diffusion of silicon and metal), the methods and structures disclosed herein eliminate spacer pull down effects. Therefore, the methods and structures disclosed herein reduce the incidence of shorting of the metal semiconductor alloy portions of the gate structure to other portions of the semiconductor device. In some embodiments, the encapsulation of the metal semiconductor alloy layer 30 with the at least one gate sidewall spacer 45 and the dielectric capping layer 35 also protects the gate structure 40 from being contacted by, i.e., shorted to, a misaligned via contacts (not shown) to the source region 50 or the drain region 55.

FIG. 5B depicts another embodiment of a semiconductor device 100 that includes a gate structure 40 present on a channel portion of a semiconductor substrate 5 and at least one gate sidewall spacer 45 adjacent to the gate structure 50. In one embodiment, the gate structure includes a work function metal layer 15 overlaying a gate dielectric layer 10, a semiconductor-containing layer 25 overlaying the work function metal layer 15, a metal semiconductor alloy layer 30 overlaying the semiconductor-containing layer 25, and a dielectric capping layer 35 overlaying the metal semiconductor alloy layer 30. In one embodiment, the at least one gate sidewall spacer 45 and the dielectric capping layer 30 encapsulate the metal semiconductor alloy layer 30 within the gate structure 40.

In some embodiments, following formation of the metal semiconductor alloy contacts 60 on the upper surface of the source region 50 and the drain region 55, an interlevel dielectric layer (not shown) may be blanket deposited atop the entire substrate and planarized. The dielectric material that provides the interlevel dielectric layer may be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may be formed of a dielectric material having a different composition than the dielectric capping layer 35.

The interlevel dielectric layer may be formed by various methods including, but not limited to, spinning from solution, spraying from solution, chemical vapor deposition (CVD), plasma enhanced CVD (PECVD), sputter deposition, reactive sputter deposition, ion-beam deposition, and evaporation.

The interlevel dielectric layer may be patterned and etched to form via holes to the various source/drain and conductive gate features of the semiconductor device. In some embodiments, because the interlevel dielectric layer and the dielectric capping layer 35 can be composed of different materials, selective etching may be employed to etch through the interlevel dielectric layer and the dielectric capping layer 35 in stages for forming the via for the contact to the gate structure 40. Following via formation interconnects (not shown) can be formed by depositing a conductive metal into the via holes using processing, such as CVD or plating. The conductive metal may include, but is not limited to, tungsten, copper, aluminum, silver, gold, and alloys thereof.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A semiconductor device comprising:
a gate structure present on a channel portion of a semiconductor substrate wherein the gate structure includes a work function metal layer present on a gate dielectric layer;
a semiconductor-containing layer present on the work function metal layer;
a metal semiconductor alloy layer present on the semiconductor-containing layer, wherein the metal semiconductor alloy layer is comprised of $TiSi_x$, with x ranging from 1.60 to 1.99 or from 2.01 to 2.40;
a dielectric capping layer present on the metal semiconductor alloy layer; and
at least one gate sidewall spacer adjacent to the gate structure, wherein the at least one gate sidewall spacer and the dielectric capping layer encapsulate the metal semiconductor alloy layer within the gate structure.

2. A semiconductor device comprising:
a gate structure present on a channel portion of a semiconductor substrate and at least one gate sidewall spacer adjacent to the gate structure, wherein the gate structure includes a work function metal layer present on a gate dielectric layer, a metal semiconductor alloy layer in direct contact with the work function metal layer, wherein the metal semiconductor alloy layer is comprised of $TiSi_x$, with x ranging from 1.60 to 1.99 or from 2.01 to 2.40, and a dielectric capping layer present on the metal semiconductor alloy layer, wherein the at least one gate sidewall spacer and the dielectric capping layer encapsulate the metal semiconductor alloy layer within the gate structure.

3. A semiconductor device comprising:
a gate structure present on a channel portion of a semiconductor substrate and at least one gate sidewall spacer adjacent to the gate structure, wherein the gate structure includes a work function metal layer present on a gate dielectric layer, wherein the work function metal layer comprises a base material including at least one of titanium nitride, tantalum nitride, titanium silicon nitride, tantalum silicon nitride, titanium carbide, tantalum carbide, and combinations thereof, and said base material is doped with at least one of La, Al, Dy or a combination thereof;
a metal semiconductor alloy layer in direct contact with the work function metal layer; and
a dielectric capping layer present on the metal semiconductor alloy layer, wherein the at least one gate sidewall spacer and the dielectric capping layer encapsulate the metal semiconductor alloy layer within the gate structure.

4. A semiconductor device comprising:
a gate structure present on a channel portion of a semiconductor substrate, wherein the gate structure includes a work function metal layer present on a gate dielectric layer, wherein the work function metal layer comprises a base material including at least one of titanium nitride, tantalum nitride, titanium silicon nitride, tantalum silicon nitride, titanium carbide, tantalum carbide, and combinations thereof, and said base material is doped with at least one of La, Al, Dy or a combination thereof;
a semiconductor-containing layer present on the work function metal layer;
a metal semiconductor alloy layer present on the semiconductor-containing layer;
a dielectric capping layer present on the metal semiconductor alloy layer; and
at least one gate sidewall spacer adjacent to the gate structure, wherein the at least one gate sidewall spacer and the dielectric capping layer encapsulate the metal semiconductor alloy layer within the gate structure.

5. The semiconductor device of claim 1, wherein the gate dielectric layer comprises a high dielectric constant gate dielectric material.

6. The semiconductor device of Claim 4, wherein the metal semiconductor alloy layer is composed of a material selected from the group consisting of $WSi_x$, $TaSi_x$, $NbSi_x$, $VSi_x$, and combinations thereof, wherein x ranges from 1.6 to 2.4.

7. The semiconductor device of Claim 4, wherein the metal semiconductor alloy layer is comprised of $TiSi_x$, with x ranging from 1.60 to 1.99.

8. The semiconductor device of Claim 4, wherein the metal semiconductor alloy layer is comprised of $TiSi_x$ with x ranging from 2.01 to 2.40.

9. The semiconductor device of claim 1, wherein the metal semiconductor alloy layer is composed of a material comprised of $TiSi_x$ with inclusion of up to 10 atomic percent Ta or Nb.

10. The semiconductor device of claim 1, wherein the work function metal layer comprises a base material including at least one of titanium nitride, tantalum nitride, titanium silicon nitride, tantalum silicon nitride, titanium carbide, tantalum carbide, and combinations thereof.

11. The semiconductor device of claim 10, wherein the base material is doped with at least one of La, Al, Dy or a combination thereof.

12. The semiconductor device of claim 1, wherein the semiconductor containing layer is silicon.

13. The semiconductor device of claim 1, wherein the dielectric capping layer is composed of a dielectric selected from a group consisting of silicon nitride, silicon oxide, aluminum oxide, hafnium oxide, zirconium oxide, and combinations thereof.

14. The semiconductor device of Claim 4, wherein the gate structure comprises a silicon oxynitride interface layer ($SiO_xN_y$) that is present on a silicon surface having a (100) crystal orientation of the semiconductor substrate, said gate dielectric layer of a high-k material on the silicon oxynitride interface layer, said work function metal layer of a doped titanium nitride (TiN) present on the gate dielectric layer, said semiconductor-containing layer of silicon (Si) on the work function metal layer, and said metal semiconductor alloy layer of nickel silicon (NiSi) on the semiconductor-containing layer.

15. The semiconductor device of claim 1 further comprising an interlevel dielectric layer that is present over the gate structure and the at least one gate sidewall spacer, wherein the interlevel dielectric layer has a different composition than the dielectric capping layer.

16. The semiconductor device of claim 1, wherein an upper surface of the at least one gate sidewall spacer is coplanar with an upper surface of the dielectric capping layer.

17. The semiconductor device of claim 2, wherein the gate dielectric layer comprises a high dielectric constant gate dielectric material.

18. The semiconductor device of claim 3, wherein the metal semiconductor alloy layer is composed of a material selected from the group consisting of $WSi_x$, $TiSi_x$, $TaSi_x$, $NbSi_x$, $VSi_x$, and combinations thereof, wherein x ranges from 1.6 to 2.4.

19. The semiconductor device of claim 2, wherein the metal semiconductor alloy layer includes up to 10 atomic percent Ta or Nb.

20. The semiconductor device of claim 2, wherein the work function metal layer comprises a base material including at least one of titanium nitride, tantalum nitride, titanium silicon nitride, tantalum silicon nitride, titanium carbide, tantalum carbide, and combinations thereof.

21. The semiconductor device of claim 20, wherein the base material is doped with at least one of La, Al, Dy or a combination thereof 22. The semiconductor device of claim 2, wherein the dielectric capping layer is composed of a dielectric selected from a group consisting of silicon nitride, silicon oxide, aluminum oxide, hafnium oxide, zirconium oxide, and combinations thereof.

23. The semiconductor device of claim 2 further comprising an interlevel dielectric layer that is present over the gate structure and the at least one gate sidewall spacer, wherein the interlevel dielectric layer has a different composition than the dielectric capping layer.

24. The semiconductor device of claim 2, wherein an upper surface of the at least one gate sidewall spacer is coplanar with an upper surface of the dielectric capping layer.

25. The semiconductor device of claim 4 further comprising an interlevel dielectric layer that is present over the gate structure and the at least one gate sidewall spacer.

* * * * *